United States Patent [19]
Bodas

[11] Patent Number: 5,334,888
[45] Date of Patent: Aug. 2, 1994

[54] FAST EXCLUSIVE-OR AND EXCLUSIVE-NOR GATES

[75] Inventor: Milind A. Bodas, Sunnyvale, Calif.

[73] Assignee: Intel Corporation, Santa Clara, Calif.

[21] Appl. No.: 49,558

[22] Filed: Apr. 19, 1993

[51] Int. Cl.[5] ............................................. H03K 19/21
[52] U.S. Cl. ....................................... 307/471; 307/451
[58] Field of Search .......................... 307/451, 471, 448

[56] References Cited

U.S. PATENT DOCUMENTS

| | | | |
|---|---|---|---|
| 4,417,161 | 11/1983 | Uya | 307/451 |
| 4,541,067 | 9/1985 | Whitaker | 307/471 |
| 4,575,648 | 3/1986 | Lee | 307/471 |
| 5,155,387 | 10/1992 | Fletcher | 307/471 |

Primary Examiner—Edward P. Westin
Assistant Examiner—Andrew Sanders
Attorney, Agent, or Firm—Blakely Sokoloff Taylor & Zafman

[57] ABSTRACT

XOR and XNOR logic gates each include a first MOS pass device coupled between a first input and the output of the logic gate, and second MOS pass device coupled between a second input and the output of the logic gate. The control input of the first pass device is coupled to the second input and the control input of the second pass device is coupled to the first input. First and second logic signals are coupled to first and second inputs, respectively. First and second input signals are also coupled to third and fourth MOS devices, respectively. Third and fourth MOS devices are coupled in series between the logic gates output and a reference potential. The first and second MOS pass devices have the opposite channel type than the third and fourth MOS devices such that the XOR gate includes first and second PMOS pass gates and third and fourth NMOS devices. The XNOR gate includes first and second NMOS pass gates and third and fourth PMOS devices.

5 Claims, 1 Drawing Sheet

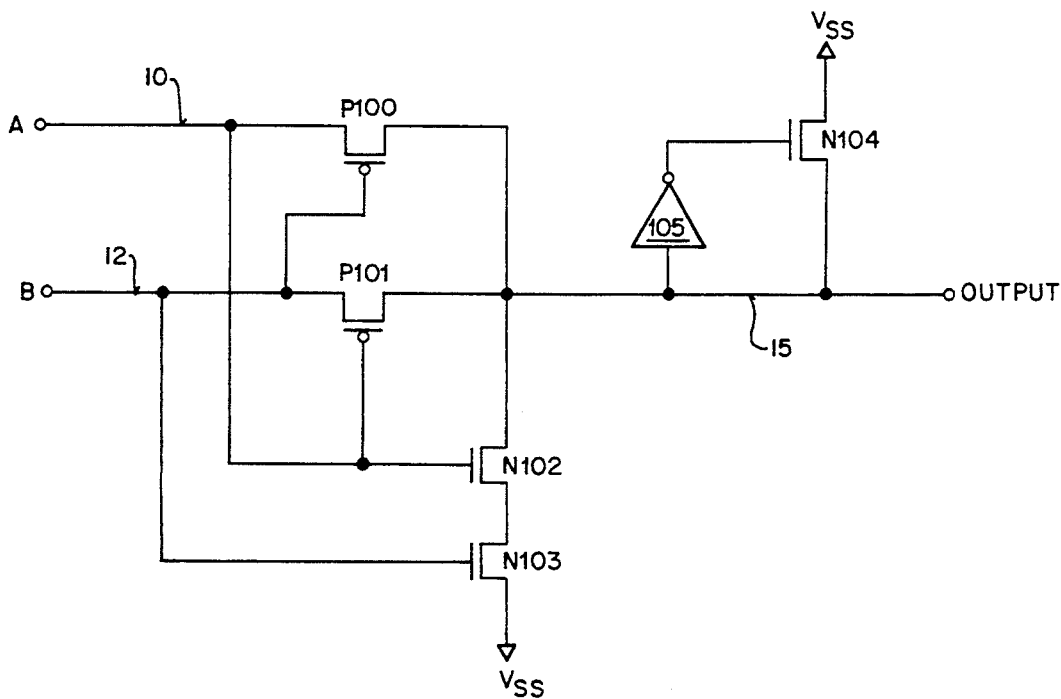
FIG_1
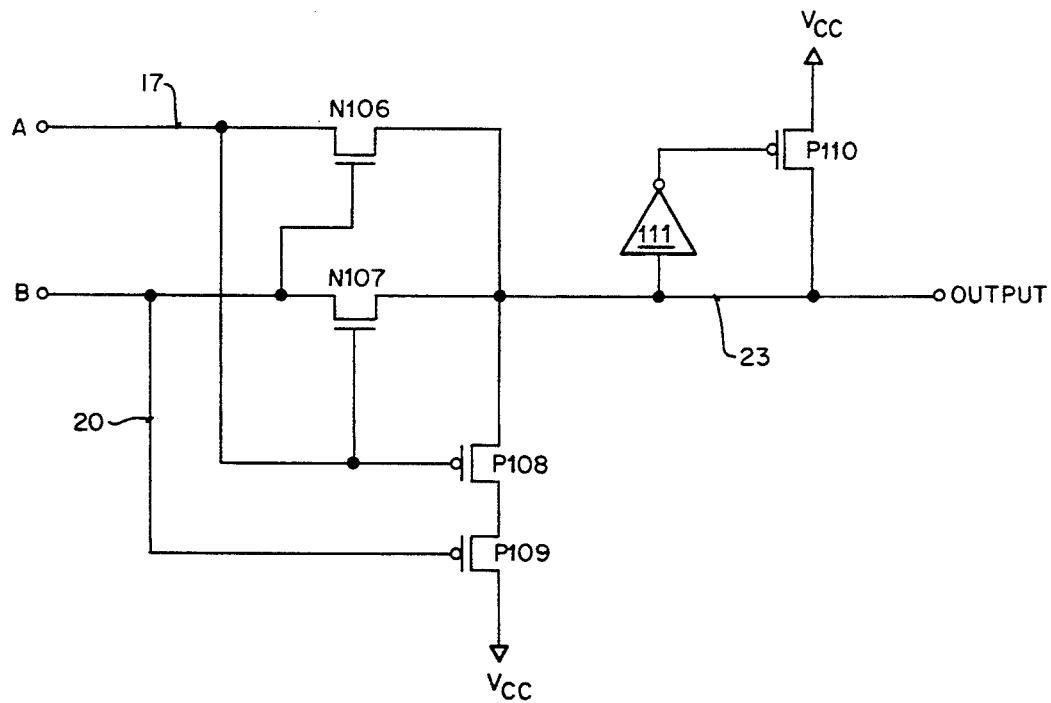
FIG_2

FAST EXCLUSIVE-OR AND EXCLUSIVE-NOR GATES

FIELD OF THE INVENTION

The present invention relates to the field of digital circuits; particularly to EXCLUSIVE-OR and EXCLUSIVE-NOR logic gates.

BACKGROUND OF THE INVENTION

The EXCLUSIVE-OR (XOR) and the EXCLUSIVE-NOR (XNOR) type of logic gates are utilized as basic building blocks in many digital integrated circuit (IC) designs. Thus, a significant amount of emphasis is placed on reducing the speed and size of a these logic gates so as to minimize the total size of the IC while enhancing the speed of operation. In other words, the smaller and faster the designer can make a logic gate, the more desirable.

In digital circuit design, complex functional gates are designed using basic gates like inverters, passgates, and also discrete transistors. Each of those may contribute a finite amount of delay to the total delay of the complex gate. The number of such basic gates an input has to propagate through is referred to as the number of gate levels. Worst case delays often result when the input must propagate through the largest number of gate levels. One way in which circuit designers can increase the speed of logic is by reducing the number of gate levels in the worst case signal path.

Current XOR and XNOR logic gate designs utilize a minimum of six transistors. Typically, input signals need to pass through two gate levels in order to propagate to the output. Thus, the total delay of the XOR/XNOR gate is established by these two gate levels. In addition, all six transistors are commonly utilized to perform the logical functions of the XOR/XNOR gate and therefore need to be large enough so as to reduce resistive loading to subsequent logic stages. In other words, in prior art designs all six transistors must be relatively large such that they determine the overall size of the XOR or XNOR gate.

As will be seen, the presently invented XOR and XNOR gates comprise four instead of six primary transistors for performing the gates' logical functions. Since only four large transistors are utilized, the overall size of the XOR and XNOR gates of the present invention are smaller than prior art gates. In addition, unlike prior art designs in which a signal must pass through two gate levels to get from the input to the output, the gates of the present invention XOR/XNOR are designed in such a way that signal propagation is only through a single gate level. Thus, a smaller, faster XOR/XNOR gate is realized.

SUMMARY OF THE INVENTION

Fast EXCLUSIVE-OR and EXCLUSIVE-NOR gates are disclosed each having delays equivalent to a single transistor gate delay. In addition, only four transistors determine the overall size of each of the logic gates.

In a first embodiment, first and second input signals are coupled to the inputs of the XOR gate of the present invention through first and second PMOS pass gates, respectively. Both of the PMOS pass gates have their outputs connected to the output of the XOR gate. In addition, a pair of NMOS devices are connected in series between the output of the logic gate and a reference potential corresponding to a logic low level. The first input signal is also connected to the control gate of the second PMOS pass gate and the gate of one of the pair of NMOS devices. Similarly, the second input signal is connected to the control gate of the first PMOS pass gate and the gate of the other NMOS device.

When both of the first and second input signals are low, both pass gates are on. As a result, both PMOS pass gates drive the output low. When one input signal is high and the other low, one pass gate is on and the other is off. This causes the PMOS pass gate that is on to drive the output high. Finally, when both inputs are high, both pass gates are off and the pair of NMOS devices are on. As a result, the output is driven to the reference potential coupled to the drain of the NMOS device, i.e. a logic low level.

A second embodiment of the XOR gate of the present invention includes a pull-down circuit for driving the output of the logic gate all the way to a logic low level when both input signals are low. The purpose of the pull-down circuit is to compensate for the small voltage drop across the PMOS pass gates that are driving the output of the logic gate low. Because of this small voltage drop the pass gates are unable to drive the output all the way to a voltage corresponding to a low logic level. The pull-down circuit functions such that as the output starts to transition low, the pull-down circuit is activated and the output is driven all the way to the low logic level.

The XNOR gate of the present invention is similar to the XOR gate except that the pass gates are NMOS devices instead of PMOS devices. Further, a pair of PMOS devices, instead of NMOS devices, are connected in series between the output of the logic gate and a reference potential corresponding to a logic high level.

When both first and second input signals of the XNOR gate are high, both pass gates are on and both NMOS pass gates drive the output high. When one input signal is high and the other low, one pass gate is on and the other is off. Thus, one pass gate drives the output low. Finally, when both inputs are low, both pass gates are off and both of the PMOS devices are on. As a result, the output is driven to the reference potential coupled to the source of one of the pair of PMOS devices, i.e. logic high level.

Another embodiment of the XNOR gate of the present invention includes a pull-up circuit for driving the output of the logic gate all the way to a logic level when both of the input signals are high. The purpose of the pull-up circuit is to compensate for the small voltage drop that occurs across the NMOS pass gates that are driving the output high. Because of this small drop, the pass gates are unable to drive the output all the way to the high voltage. The pull-up circuit functions such that when the output signal starts to transition high, the pull-up circuit is activated and the output is driven all the way to a voltage corresponding to a high logic level.

BRIEF DESCRIPTION OF THE DRAWINGS

FIG. 1 illustrates the XOR gate of the present invention with a pull-down circuit.

FIG. 2 illustrates the XNOR gate of the present invention with a pull-up circuit.

DETAILED DESCRIPTION

EXCLUSIVE-OR (XOR) and EXCLUSIVE-NOR (XNOR) logic gates are described. In the following description, numerous specific details are set forth in order to provide a thorough understanding of the present invention. It will be obvious, however, to one skilled in the art that these specific details need not be employed to practice the present invention. In other instances, well-known logic gates are not described in detail in order not to unnecessarily obscure the present invention.

FIG. 1 shows the XOR gate of the present invention. As can be seen, input signal A is connected to the input of pass gate P100 (line 10), to the control gate of P101 (line 11) and to the gate of N102 (line 11). Input signal B is connected to the input of pass gate P101 (line 12), to the control gate of P100 (line 16) and the gate of N103 (line 16). Both of the outputs of pass gates P100 and P101 are connected together at common output node 15. NMOS devices N102 and N103 are connected in series between output rode 15 and a voltage corresponding to a logic low level, i.e., $V_{SS}$.

The pass gates in FIG. 1, P100 and P101, function such that when their control gates are low, they drive the output to a voltage level equal to whatever is on their input. Thus, when both input signals A and B are low, both pass gates P100 and P101 are on. And, since the inputs of both pass gates are low, each pass gate simultaneously drives output node 15 low. Devices N102 and N103 are both off because their gates are low. Consequently, they have no affect on the output signal.

When input signal A is high and input signal B is low, pass gate P101 is off and pass gate P100 is on. As a result, whatever voltage is coupled to the input of pass gate P100, i.e., input signal A, will pass through to the output. Since input signal A is high, the output of the gate is driven high by pass gate P100. The gate of N102 is high and therefore is on, but device N103 is off. Consequently, devices N102 and N103 have no affect on output node 15.

Similarly, when input signal A is low and input signal B is high, pass gate P101 is on and and P100 is off. As a result, pass gate P101 drives output 15 high.

In the final case when both input signals A and B are high, pass gates P100 and P101 are both off and NMOS devices, N102 and N103, are on. This causes the output to be driven to the voltage that is coupled to the drain of N103, i.e., $V_{SS}$. Thus, when both inputs are high, the output is driven low.

Table 1 is a logic table for the XOR function and also gives a summary of the circuit conditions for the XOR gate of the present invention for each input case.

TABLE 1

| Input A | Input B | Output Node 15 | Comment |
|---|---|---|---|
| 0 | 0 | 0 | Both pass gates on and driving the output low. |
| 1 | 0 | 1 | One pass gate on, the other off; the active pass gate driving the output high. |
| 0 | 1 | 1 | Same as above |
| 1 | 1 | 0 | Both pass gates off and both NMOS devices on and driving the output low. |

Another embodiment of the XOR gate of the present invention includes a pull-down circuit coupled to output node 15 as shown in FIG. 1. The pull-down circuit includes inverter 105 and NMOS device N104. This portion of the XOR gate is utilized when both PMOS pass gates are on and are ideally driving the output low; i.e. (A=0 and B=0; output 15=0). However, the PMOS devices can only drive node 15 to a voltage equal to $V_{SS}+V_{t(P)}$ due to their electrical characteristics, (where $V_{t(P)}$ is a voltage equal to the threshold voltage of the PMOS pass gate). The pull-down circuit is utilized to drive the output all the way to a voltage level equal to $V_{SS}$, i.e., a logic low level.

Referring to FIG. 1, when signals A and B are both low, the output of the logic gate is driven towards a logic low level voltage by both of the pass gates. When output node 15 is at a voltage level less than the trip point of inverter 105, the output of the inverter is high. Since the output of inverter 105 is coupled to the input of N104, device N104 is activated. Further, since $V_{SS}$ is connected to the source of N104, output node 15 is driven all the way to a potential equal to a low logic level, i.e., $V_{SS}$.

The XOR and XNOR gates of the present invention are very similar. Referring to FIG. 2, input signal A makes three connections; i.e., to the input of pass gate N106 (line 17), to the control gate of N107 and to the gate of P108. Input signal B is connected to the input of pass gate N107 (line 20), to the control gate of N106 and the gate of P109. Both of the outputs of pass gates N106 and N107 are connected together at common output node 23. PMOS devices P108 and P109 are connected in series between output node 23 and a voltage corresponding to a logic high level, i.e., VCC.

The pass gates in FIG. 2, N106 and N107, function such that when their control gates are high, they drive the output to a voltage potential equal to whatever is on their input. In the case when both input signals A and B are high, both pass gates N106 and N107 are on and simultaneously drive output node 23 high. Devices P108 and P109 are both off because their gates are high.

When input signal A is high and input signal B is low, pass gate N106 is off and pass gate N107 is on. As a result whatever, voltage is coupled to the input of pass gate N107, i.e., input signal B, will pass through to the output. Since input signal B is low, the output of the gate is driven low by pass gate N107. The gate of P109 (line 22) is low and therefore is on, but device P108 is off. Consequently, devices P108 and P109 have no affect on output node 23.

Similarly, when input signal A is low and input signal B is high, pass gate N106 is on and N107 is off. As a result, pass gate N106 drives output 23 low.

In the final case, when both input signals A and B are low, pass gates N106 and N107 are both off and PMOS gates, P108 and P109 are on. This causes the output to be driven to the voltage that is coupled to the drain of P109, i.e., $V_{CC}$. Thus, when both inputs are low, the output is also high.

Table 2 shows the logic table for the XNOR function and gives a summary of the circuit conditions for the XNOR gate of the present invention for each input condition.

TABLE 2

| Input A | Input B | Output Node 15 | Comment |
|---|---|---|---|
| 0 | 0 | 1 | Pass gates N106 and N107 are off; P108 and P109 are on and driving the output high. |
| 1 | 0 | 0 | One pass gate is on the |

TABLE 2-continued

| Input A | Input B | Output Node 15 | Comment |
| --- | --- | --- | --- |
| | | | other off; the active pass gate is driving the output low. |
| 0 | 1 | 0 | Same as above |
| 1 | 1 | 1 | Pass gates N106 and N107 are on and driving the output high. |

Another embodiment of the XNOR gate of the present invention includes a pull-up circuit coupled to output node 23 as shown in FIG. 2. The pull-up circuit includes inverter 111 and PMOS device P110. This portion of the XNOR gate is utilized when both NMOS pass gates are on and are ideally driving the output high; i.e., (A=1 and B=1; output 15=1). However, the NMOS devices can only drive node 23 to a voltage equal to $V_{CC}-V_{t(N)}$ due to their electrical characteristics, (where $V_{t(N)}$ is a voltage equal to the threshold voltage of the NMOS pass gate). The pull-up circuit is utilized to drive the output all the way to a voltage level equal to $V_{CC}$, i.e., a logic high level.

Referring to FIG. 2, when signals A and B are both high, the output of the logic gate is driven towards a logic high level voltage by both of the pass gates. When output node 23 is at a voltage level greater than the trip point of inverter 111, the output of the inverter is low. Since the output of inverter 111 is coupled to the input of P110, device P110 is activated. Further, since $V_{CC}$ is coupled to the drain of P110, output node 23 is driven all the way to a potential equal to $V_{CC}$.

Although the FIGS. 1 and 2 shown the XOR and XNOR gates of the present invention is shown with the pull-down (XOR gate) or pull-up (XNOR gate), each logic gate may be utilized without this additional circuitry. The pull-down and pull-up circuits are added to the gates to enhance their operation.

Whereas many alternations and modifications to the present invention will no doubt become apparent to the person of ordinary skill in the art after having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

I claim:

1. A circuit comprising:
    an output node;
    a first input node receiving a first signal and a second input node receiving a second signal, said first and second signals being driven between a first and a second logic level;
    a first gate passing said first signal from said first input node to said output node, said first gate being coupled between said first input node and said output node and having a control terminal coupled to said second input node such that when said second signal is at said first logic level, said first gate couples said first signal to said output node;
    a second gate passing said second signal from said second input node to said output node, said second gate being coupled between said second input node and said output node and having a control terminal coupled to said first input node such that when said first signal is at said first logic level, said second gate couples said second signal to said output node;
    a pull-down circuit coupling a reference potential corresponding to said first logic level to said output node when said first and second signals are at said second logic level, said pull-down circuit being coupled to said first and second input nodes and between said reference potential and said output node; and
    a driving circuit coupled between said output node and said reference potential for driving said output node to said reference potential when said first and second signals are at said first logic level.

2. An EXCLUSIVE-OR (XOR) logic gate comprising:
    an output node;
    a first input node coupled to receive a first logic signal and a second input node coupled to receive a second logic signal, said first and second logic signals being driven between a high and a low voltage potential;
    a first p-channel metal oxide silicon (PMOS) device coupled between said first input node and said output node and having its gate coupled to said second input node, wherein when said second logic signal is at said low voltage potential, said first PMOS device couples said first logic signal to said output node;
    a second PMOS device coupled between said second input node and said output node and having its gate coupled to said first input node, wherein when said first logic signal is at said low voltage potential, said second PMOS device couples said second logic signal to said output node;
    first and second n-channel metal oxide silicon (NMOS) devices coupled in series between said output node and a reference potential substantially equal to said low voltage potential, the gate of said first NMOS device being coupled to said first input node and the gate of said second NMOS device being coupled to said second input node, wherein when said first and second logic signals are both at said high voltage potential said reference potential is coupled to said output node; and
    a driving circuit coupled between said output node and said reference potential for driving said output node to said low voltage potential when said first and second logic signals are at said low voltage potential.

3. The XOR logic gate as described in claim 2 wherein said driving circuit comprises an inverter having its input coupled to said output node and its output coupled to the gate of a third NMOS device, said third NMOS device being coupled between said output node and said reference potential.

4. An EXCLUSIVE-NOR (XNOR) logic gate having an output node, a first input node coupled to a first logic signal, and a second input node coupled to a second logic signal, said first and second logic signals being driven between a high and a low voltage potential, said XNOR gate comprising:
    a first n-channel metal oxide silicon (NMOS) device being coupled between said first input node and said output node and having its gate coupled to said second input node, wherein when said second logic signal is at said high voltage potential, said first NMOS device couples said first logic signal to said output node;

a second NMOS device being coupled between said second input node and said output node and having its gate coupled to said first input node, wherein when said first logic signal is at said high voltage potential said second NMOS device couples said second logic signal to said output node;

first and second p-channel metal oxide silicon (PMOS) devices coupled in series between said output node and a reference potential substantially equal to said high voltage potential, the gate of said first PMOS device being coupled to said first input node and the gate of the second PMOS device being coupled to said second input node, wherein when said first and second logic signals are both at said low voltage potential, said reference potential is coupled to said output node; and a driving circuit coupled between said output node and said reference potential for driving said output node to said high voltage potential when said first and second logic signals are at said high voltage potential.

5. The XNOR logic gate as described in claim 4 wherein said driving circuit comprises an inverter having its input coupled to said output node and its output coupled to the gate of a third PMOS device, said third PMOS device being coupled between said output node and said reference potential.

* * * * *

UNITED STATES PATENT AND TRADEMARK OFFICE
CERTIFICATE OF CORRECTION

PATENT NO. : 5,334,888
DATED : August 2, 1994
INVENTOR(S) : Milind A. Bodas

It is certified that error appears in the above-indentified patent and that said Letters Patent is hereby corrected as shown below:

Column 3, Line 16;    Delete "(Line 11)" both occurences
    Column 3, Line 18;    Delete "(Line 16)"
    Column 3, Line 19;    Delete "(Line 16)"
    Column 3, Line 22;    Delete "rode"; Insert--node--

Signed and Sealed this

Nineteenth Day of September, 1995

Attest:

BRUCE LEHMAN

*Attesting Officer*    *Commissioner of Patents and Trademarks*